US011218826B2

(12) United States Patent
Sprinkle

(10) Patent No.: US 11,218,826 B2
(45) Date of Patent: Jan. 4, 2022

(54) APPARATUS AND METHOD FOR SPEAKER TUNING AND AUTOMATIC DIGITAL SIGNAL PROCESSING CONFIGURATION

(71) Applicant: HARMAN INTERNATIONAL INDUSTRIES, INCORPORATED, Stamford, CT (US)

(72) Inventor: Charles Sprinkle, Ventura, CA (US)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 16/617,305

(22) PCT Filed: Jun. 1, 2018

(86) PCT No.: PCT/US2018/035683
§ 371 (c)(1),
(2) Date: Nov. 26, 2019

(87) PCT Pub. No.: WO2018/223052
PCT Pub. Date: Dec. 6, 2018

(65) Prior Publication Data

US 2020/0169821 A1 May 28, 2020

Related U.S. Application Data

(60) Provisional application No. 62/513,866, filed on Jun. 1, 2017.

(51) Int. Cl.
*H04R 29/00* (2006.01)
*H04R 1/02* (2006.01)
(Continued)

(52) U.S. Cl.
CPC ........... *H04R 29/002* (2013.01); *H04R 1/026* (2013.01); *H04R 1/26* (2013.01); *H04R 1/403* (2013.01);
(Continued)

(58) Field of Classification Search
CPC ...................................................... H04R 29/00
See application file for complete search history.

(56) References Cited

U.S. PATENT DOCUMENTS 3,849,772 A * 11/1974 Burnett .................. G01R 31/50 340/635
5,153,915 A * 10/1992 Farella .................. H04R 1/025 181/150

(Continued)

FOREIGN PATENT DOCUMENTS

| | | | |
|---|---|---|---|
| CN | 102197658 | A | 9/2011 |
| EP | 1494502 | A2 | 1/2005 |
| WO | 2010051139 | A1 | 5/2010 |

OTHER PUBLICATIONS

International Search Report dated Aug. 31, 2018, PCT/US2018/035683 filed Jun. 1, 2018, 12 pgs.

(Continued)

*Primary Examiner* — Olisa Anwah
(74) *Attorney, Agent, or Firm* — Brooks Kushman P.C.

(57) ABSTRACT

A loudspeaker system including a loudspeaker array, an audio controller, and one or more insertable columns are provided. The loudspeaker array is configured to playback an audio output in a listening environment. The audio controller is configured to provide the audio output to the loudspeaker array. The one or more insertable columns is positioned between the audio controller and the loudspeaker to adjust a height of the loudspeaker array relative to the audio controller.

20 Claims, 4 Drawing Sheets

(51) Int. Cl.
*H04R 1/40* (2006.01)
*H04R 3/12* (2006.01)
*H04R 1/26* (2006.01)

(52) U.S. Cl.
CPC ......... *H04R 3/12* (2013.01); *H04R 2201/401* (2013.01)

(56) References Cited

U.S. PATENT DOCUMENTS

| | | | | |
|---|---|---|---|---|
| 5,602,366 | A | 2/1997 | Whelan et al. | |
| 7,218,746 | B2 * | 5/2007 | Schmidt | H04R 1/028 381/334 |
| 8,126,180 | B2 | 2/2012 | Jacob et al. | |
| 9,615,163 | B1 | 4/2017 | Nachman et al. | |
| 2002/0071568 | A1 * | 6/2002 | Shuttleworth | H04R 29/001 381/58 |
| 2005/0008165 | A1 | 1/2005 | Sack et al. | |
| 2008/0302945 | A1 | 12/2008 | Morrison et al. | |
| 2009/0208032 | A1 * | 8/2009 | Wu | H03F 1/305 381/94.5 |
| 2012/0237049 | A1 | 9/2012 | Brown et al. | |
| 2013/0039527 | A1 | 2/2013 | Jensen et al. | |
| 2013/0129134 | A1 * | 5/2013 | Parraga Gimeno | H04R 1/02 381/338 |
| 2016/0182996 | A1 | 6/2016 | Takumai | |
| 2017/0332166 | A1 * | 11/2017 | Kikuchi | H04R 1/06 |
| 2018/0149694 | A1 * | 5/2018 | Miyazaki | H02P 7/00 |
| 2018/0220212 | A1 * | 8/2018 | Lupfer | H04R 1/02 |

OTHER PUBLICATIONS

Second Chinese Office Action for Chinese Application No. 201880035777.8 dated Jun. 22, 2021, 4 pgs.
Extended European Search Report for European Application No. 18810161.2 dated Jan. 26, 2021, 10 pgs.
First Chinese Office Action for Application No. 201880035777.8 dated Jan. 12, 2021, 6 pgs.
Third Chinese Office Action for Chinese Application No. 201880035777.8 dated Nov. 3, 2021, 4 pgs.

* cited by examiner

APPARATUS AND METHOD FOR SPEAKER TUNING AND AUTOMATIC DIGITAL SIGNAL PROCESSING CONFIGURATION

CROSS-REFERENCE TO RELATED APPLICATIONS

This application is the U.S. National Phase of PCT Application No. PCT/US2018/035683 filed Jun. 1, 2018, which claims the benefit of U.S. provisional application Ser. No. 62/513,866 filed Jun. 1, 2017, the disclosures of which are incorporated herein by reference.

TECHNICAL FIELD

Aspects disclosed herein generally relate to a system and method for speaker tuning and automatic digital signal processing (DSP) configuration.

BACKGROUND

U.S. Pat. No. 9,615,163 to Nachman et al. discloses a loudspeaker port that may include tunable physical components to tune the port to different frequencies to improve speaker efficiency at those frequencies. The ports may be activated by at least partly opening associated shutters, or disabled by closing the associated shutters. Activated ports may enhance speaker efficiency in a frequency range. However, activated ports may also introduce sound artifacts, thereby reducing sound quality. Therefore, the ports may be disabled when appropriate to reduce their negative impact to sound quality. A Digital Signal Processor (DSP) may determine the frequency components of a played sound to determine when to open the ports and how to tune the ports. Accordingly, a loudspeaker may benefit from the improved efficiency facilitated by the ports while also avoiding typical drawbacks created by the ports.

SUMMARY

In at least one embodiment, a loudspeaker system is provided. The loudspeaker system includes a loudspeaker array, an audio controller, and one or more insertable columns. The loudspeaker array is configured to playback an audio output in a listening environment. The audio controller is configured to provide the audio output to the loudspeaker array. The one or more insertable columns is positioned between the audio controller and the loudspeaker to adjust a height of the loudspeaker array relative to the audio controller.

In at least another embodiment, a loudspeaker system is provided. The loudspeaker system includes a loudspeaker array, an audio controller, and one or more insertable columns. The loudspeaker array is configured to playback an audio output in a listening environment. The audio controller is configured to provide the audio output to the loudspeaker array. The one or more insertable columns are positioned between the audio controller and the loudspeaker array to adjust a height of the loudspeaker array relative to the audio controller based on a size of the listening environment.

In at least one embodiment, a loudspeaker system is provided. The loudspeaker system includes a loudspeaker array, one or more insertable columns, and an audio controller. The loudspeaker array is configured to playback an audio output in a listening environment. The one or more insertable columns is electrically connected to the loudspeaker array. The audio controller is configured to provide the audio output to the loudspeaker array via the one or more insertable columns.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompanying drawings in which:

DETAILED DESCRIPTION

Figure 1:
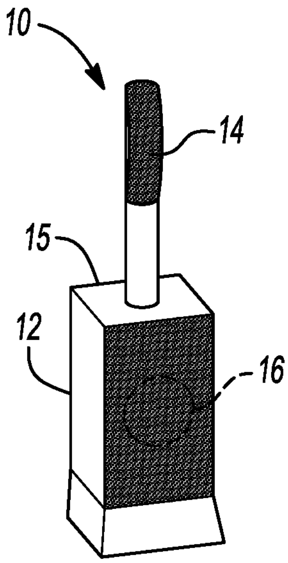
FIG. 1 generally depicts a speaker system for automatic DSP adjustment based on a first length in accordance to one embodiment.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The embodiments of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and other electrical devices. Such circuits and other electrical devices may be combined with each other and/or separated in any manner based on the particular type of electrical implementation that is desired. It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof)

and software which co-act with one another to perform operation(s) disclosed herein. In addition, any one or more of the electrical devices may be configured to execute a computer-program that is embodied in a non-transitory computer readable medium programmed to perform any number of the functions as disclosed.

Aspects disclosed herein provide a speaker system including an audio controller that detects a voltage and/or other mechanical switch that indicates a physical configuration of at least one loudspeaker and adjusts digital signal processing (DSP) tuning parameters automatically based on the voltage or the output of the mechanical switch. The speaker system includes an audio controller that provides an audio input signal to the at least one loudspeaker for audio playback. One or more insertable columns may be positioned between the audio controller and the at least one loudspeaker to adjust a distance (or height) between the audio controller and the at least one loudspeaker based on a desired audio output from the at least loudspeaker. In one example, each column may include any number of resistors and various wires to connect to a connector of the at least one loudspeaker. The audio controller measures the voltage across the resistor(s) and also determines whether the at least one loudspeaker is connected to wires of the system. The audio controller adjusts tuning parameters of the at least one loudspeaker based on the number of resistors that are connected (i.e., based on the measured voltage which varies based on the height of the at least one loudspeaker in reference to the audio controller). The number of resistors implemented in the speaker system is based on the overall height of the at least one loudspeaker to the audio controller. As the height increases, the number of resistors increase and the overall resistance increases. Conversely, as the height decreases, the number of resistors that are connected to the audio controller decrease and the overall resistance decreases. In addition, the audio controller mutes the at least one loudspeaker and a bass woofer from playing back the audio input signal if the at least one loudspeaker is disconnected from the audio controller.

FIG. 1 generally depicts a speaker system 10 for automatic DSP adjustment based on a first length in accordance to one embodiment. The system 10 generally includes an audio controller 12 and a loudspeaker array 14. The number of loudspeakers implemented in the array 14 may vary based on the desired criteria of a particular implementation. The audio controller 12 is generally configured to transmit an audio input signal to the loudspeaker array 14. The loudspeaker array 14 plays back the audio input signal for a user. The loudspeaker array 14 may playback the audio input signal at any frequency over 300 Hz. For example, the loudspeaker array 14 may include any number of tweeters and/or mid-range speakers to playback the audio input signal for the noted frequencies.

Figure 2:
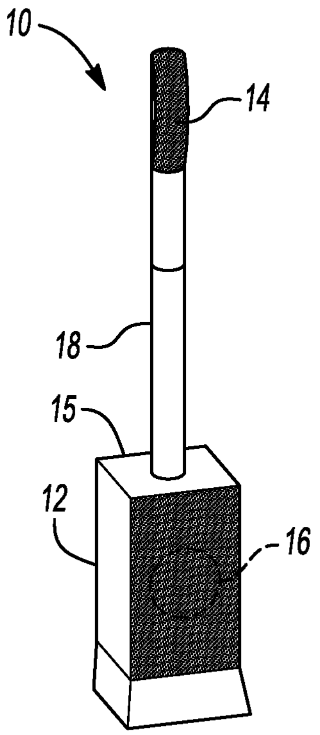
FIG. 2 generally depicts the speaker system for automatic DSP adjustment based on a second length in accordance to one embodiment.

The audio controller 12 includes at least one loudspeaker 16 that may be any number of woofers and play back the audio input signal at frequencies less than 300 Hz. A loudspeaker enclosure 15 includes the audio controller 12 and the at least one loudspeaker 16. The overall height between the audio controller 12 and the loudspeaker array 14 as illustrated in FIG. 1 may correspond to a default height in which it is not necessary for the audio controller 12 to adjust various DSP related tuning parameters for the loudspeaker array 14. However, the system 10 enables a user to adjust the height (or distance) between the audio controller 12 and the loudspeaker array 14 to accommodate playing back the audio input signal in a larger room or venue. As shown in FIG. 1, the user increases the height between the loudspeaker array 14 and the loudspeaker enclosure 15. In addition, the user may desire to adjust the height to accommodate for audience location/seating. To this end, FIG. 2 depicts the speaker system 10 in which the user can increase the height between the audio controller 12 and the loudspeaker array 14 by adding one or more insertable columns (or spacers) 18. For example, the user may insert the column(s) 18 between the audio controller 12 and loudspeaker array 14. The user also has the option of removing the column(s) 18 as desired to return the speaker system 10 to its default position for audio playback. The speaker system 10, as illustrated in FIG. 2, provides a single column 18 between the audio controller 12 and the loudspeaker array 14.

Figure 3:
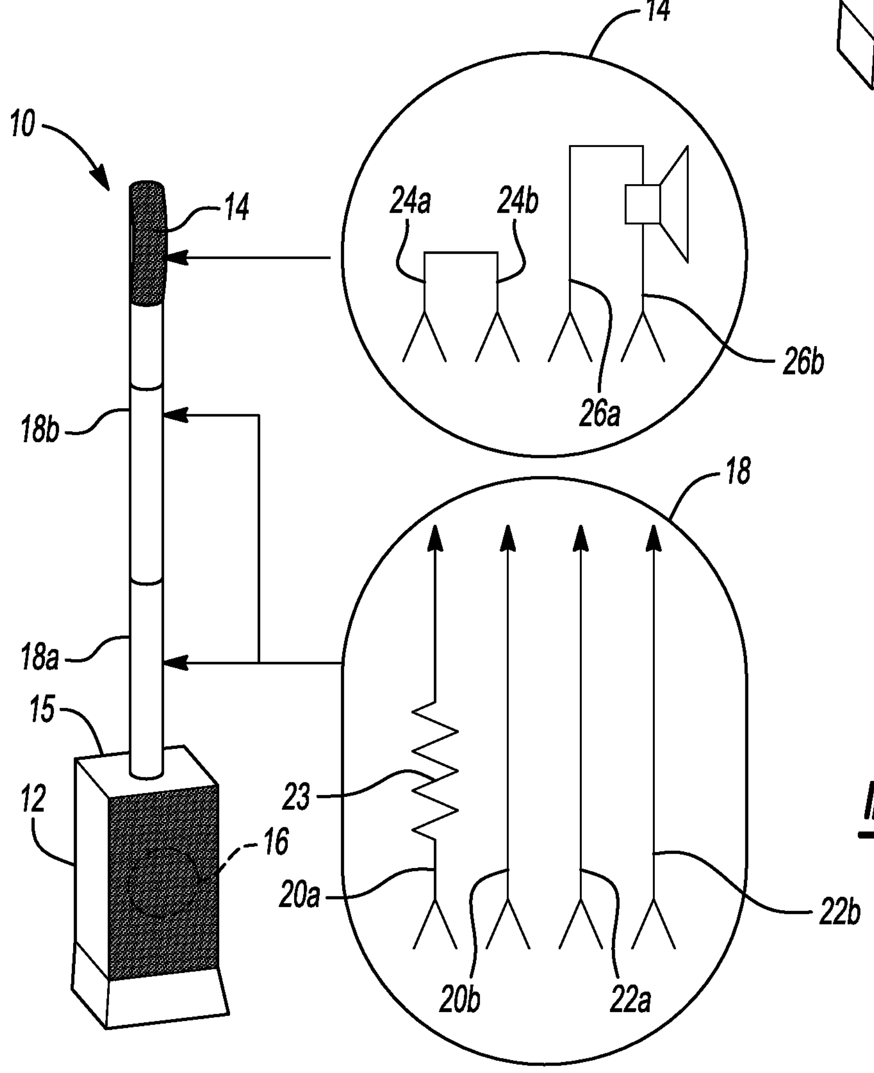
FIG. 3 generally depicts the speaker system for automatic DSP adjustment based on a third length in accordance to one embodiment.

FIG. 3 generally depicts the speaker system 10 in which columns **18*a* and 18*b* (i.e., multiple columns) are inserted between the audio controller 12 and the loudspeaker array 14. As shown, the addition of the columns 18*a* and 18*b* increase the height between the audio controller 12 and the loudspeaker array 14 (or the loudspeaker enclosure 15). It is generally recognized that as the height between the audio controller 12 and the loudspeaker array 14 changes, tuning parameters may need to be changed to ensure that the loudspeaker array 14 properly plays back the audio input signal accordingly in conjunction with the loudspeaker 16. The audio controller 12 includes a digital signal processor (not shown) that includes various tuning parameters that can be altered based on the overall height of the loudspeaker array 14. Each column 18 generally includes a first pair of wires 20*a*-20*b* and a second pair of wires 22*a*-22*b*. The first wire 20*a* includes at least one resistor 23. It is recognized that any number of resistor(s) 23 may be implemented in a single column 18. The loudspeaker array 14 generally includes a third pair of wires 24*a*-24*b* and a fourth pair of wires 26*a*-26*b*. The audio controller 12 is electrically connected to the first, second, third, and fourth pairs of wires 20*a*-20*b*, 22*a*-22*b*, 24*a*-24*b*, and 26*a*-26*b*, respectively. Each column 18 may be coupled to one another or to the loudspeaker array 14 via a snap and lock arrangement or via interference fit with ends thereof (i.e., ends of the column 18**).

In general, the first pair of wires **20*a*-20*b* is electrically connected to the third pair of wires 24*a*-24*b*, respectively, and the second pair of wires 22*a*-22*b* is electrically connected to the fourth pair of wires 26*a*-26*b*, respectively. As shown, the third pair of wires 24*a*-24*b* form a circuit with the first pair of wires 20*a*-20*b* and the audio controller 12. Likewise, the fourth pair of wires 26*a*-26*b* form a circuit with the second pair of wires 22*a*-22*b*. In operation, the audio controller 12 measures the voltage across the resistor(s) 23 and adjusts various DSP tuning related parameters to account for the height of the loudspeaker array 14. As expected, the measured voltage corresponds to the resistance values of the resistor(s) 23 and on an overall resistance of the wires 20*a*, 20*b*, 22*a*, 22*b*, 24*a*, 24*b*, etc. themselves. The overall resistance of the wires 20*a*, 20*b*, 22*a*, 22*b*, 24*a*, 24*b* may be attributed the type and/or gauge of the wire in addition to the overall height (or length) of these wires with respect to the audio controller 12 (or portion of the enclosure 15 in which the audio controller 12 is positioned). Each column 18 may include electrical connectors (not shown) for coupling the various wires 20*a*, 20*b*, 22*a*, 22*b*, 24*a*, 24*b*, etc. For example, the audio controller 12 may control parameters such as but not limited to a delay, EQ, parametric parameters, etc. based on the measured voltage (or current) (or measured electrical output) (e.g., the height of the loudspeaker array 14). With the increase in height and the adjustment of tuning parameters, the system 10 avoids source separation where the user perceives sound coming from different locales. Instead, the loudspeaker array 14 plays back the audio input signal seamlessly with the loudspeaker 16 and this may hold true for any height. For example, when the loudspeaker array 14 is in its lowest position, the user does not get the impression that the loudspeaker array 14 and the loudspeaker 16 are competing with one another such as a smearing sound. Rather, there is a nice and smooth blend of the audio between the loudspeaker array 14 and the loudspeaker 16**.

Thus, depending on the number of columns 18 inserted between the audio controller 12 and the loudspeaker array 14, the measured voltage across the resistors 24 vary accordingly and the audio controller 12 adjusts the tuning parameters of the loudspeaker array 14 based on measured voltage. This condition is based on the overall height of the loudspeaker array 14. Likewise, when the loudspeaker array 14 is electrically disconnected from the audio controller 12 (e.g., the wires 26*a*-26*b* are disconnected from either the second pair of wires 22*a*-22*b* or from input pins (not shown) of the audio controller 12), the audio controller 12 detects an open circuit condition and ceases to transmit the audio input signal (e.g., mutes the loudspeaker array 14). The audio controller 12 also disables transmitting the audio input signal to the loudspeaker 16 (or to the woofer(s)) when an open circuit condition is detected.

Figure 4:
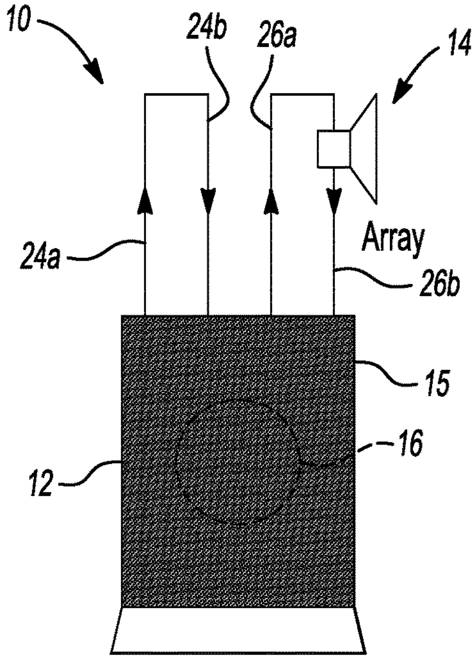
FIG. 4 generally depicts a more detailed implementation of the speaker system for automatic DSP adjustment based on the first length in accordance to one embodiment.
Figure 5:
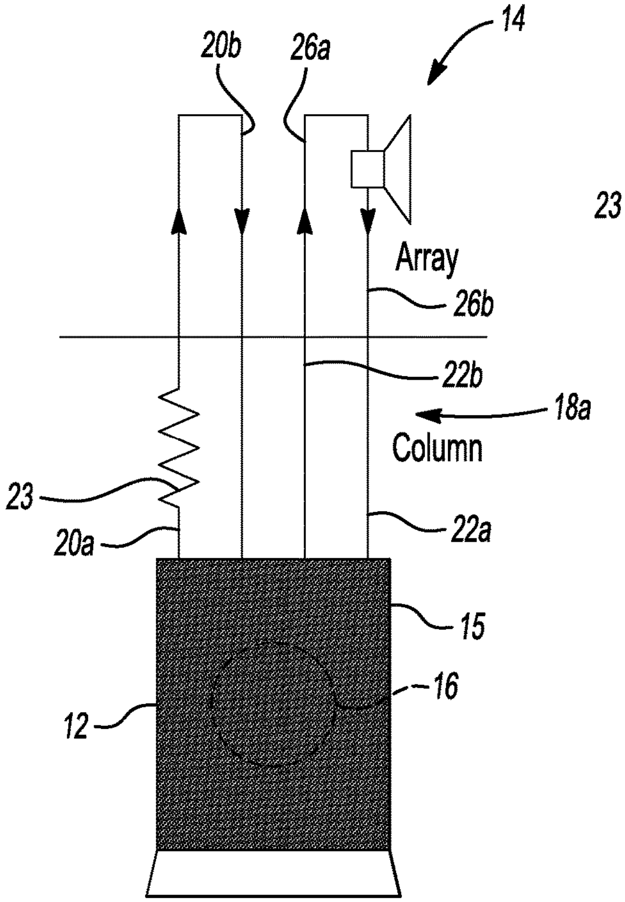
FIG. 5 generally depicts a more detailed implementation of the speaker system for automatic DSP adjustment based on the second length in accordance to one embodiment.

FIG. 4 is a more detailed view of the system 10 illustrated in FIG. 1. In this case, the system 10 is in a default position whereby no columns 18 are inserted between the audio controller 12 and the loudspeaker array 14. FIG. 5 is a more detailed view of the system 10 illustrated in FIG. 2. In this case, a single column 18 (e.g. a single resistor 23) is inserted between the audio controller 12 and the loudspeaker array 14. The insertion of the single column 18 between the audio controller 12 and the loudspeaker array 14 correspond to a first predetermined height and the audio controller 12 adjusts the tuning parameters for the loudspeaker array 14 to playback the audio input signal based on the first predetermined height (or measured voltage across the resistor 23).

Figure 6:
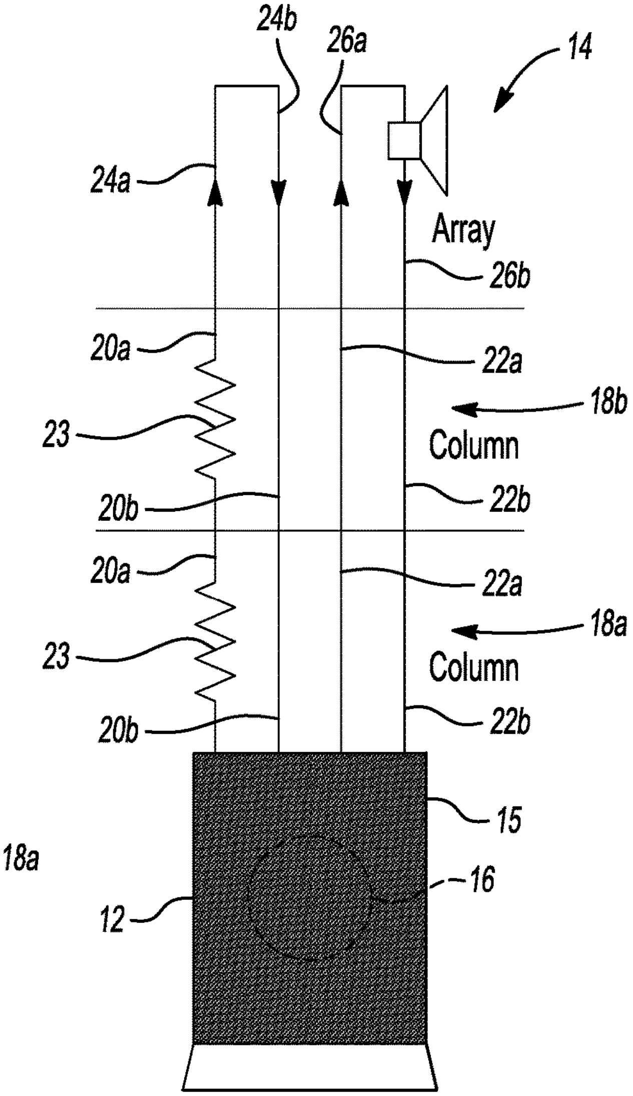
FIG. 6 generally depicts a more detailed implementation of the speaker system for automatic DSP adjustment based on the third length in accordance to one embodiment.

FIG. 6 is a more detailed view of the system illustrated in FIG. 3. In this case, two columns 18*a* and 18*b* (e.g., multiple resistors 23 are provided in series) are inserted between the audio controller 12 and the loudspeaker array 14. The insertion of the two columns 18*a* and 18*b* between the audio controller 12 and the loudspeaker array 14 correspond to a second predetermined height and the audio controller 12 adjusts the tuning parameters for the loudspeaker array 14 to playback the audio input signal based on the second predetermined height (or measured voltage across the resistors 23). As noted above, when the loudspeaker array 14 is removed from the system 10, the audio controller 12 detects an open circuit condition and ceases to transmit or provide the audio input signal until the loudspeaker array 14 is electrically coupled back to the audio controller 12. The audio controller 12 also disables transmitting the audio input signal to the loudspeaker 16 (or to the woofer(s)) when an open circuit condition is detected.

Figure 7:
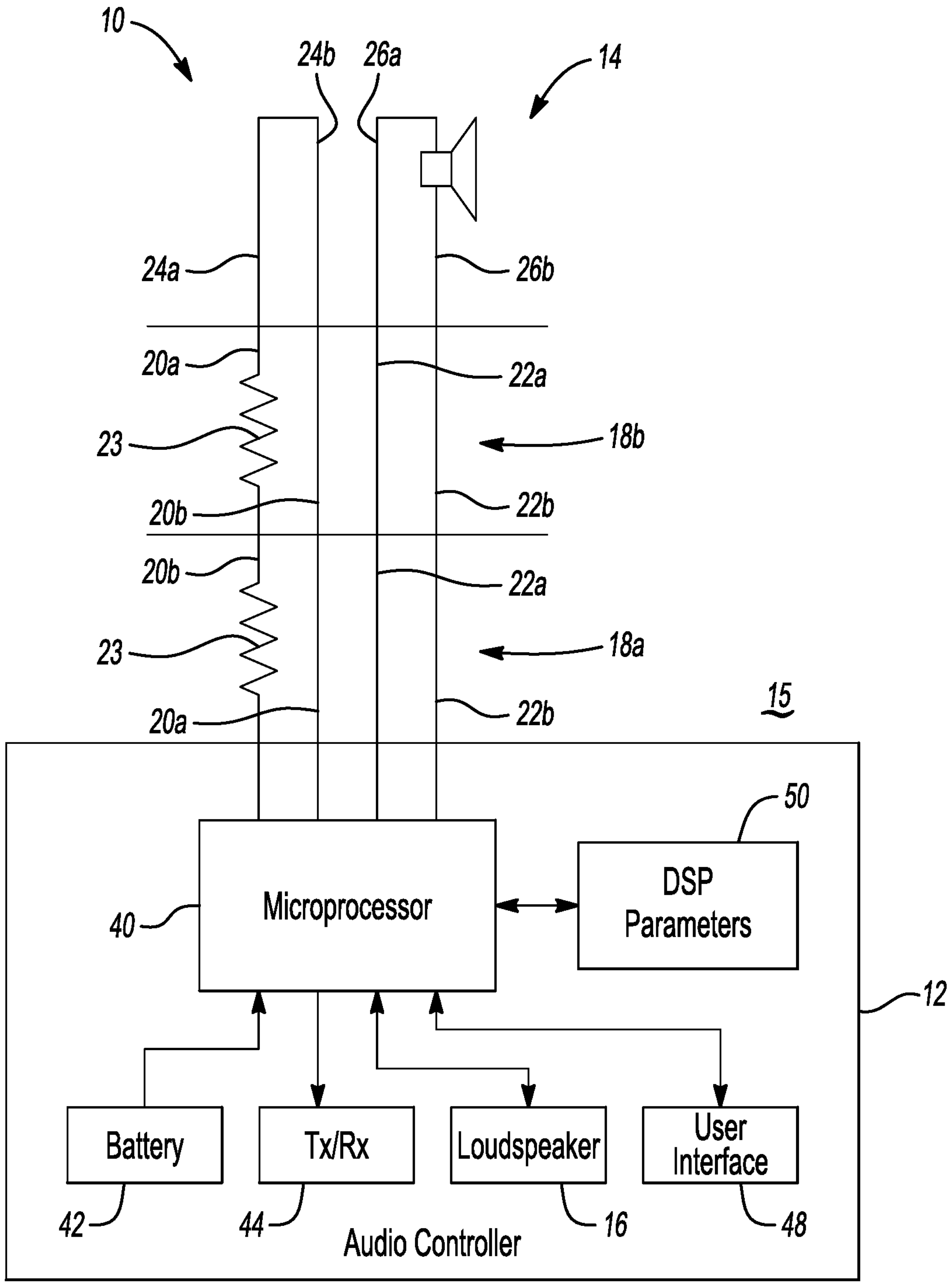
FIG. 7 generally depicts a more detailed implementation of the speaker system in accordance to one embodiment.

FIG. 7 depicts a more detailed view of the audio controller 12. The audio controller 12 includes a microprocessor 40, a rechargeable battery 42, a transceiver 44, the loudspeaker 16 (or woofer), a user interface 48 and DSP tuning parameters 50. As shown, the microprocessor 40 is electrically connected to the various columns 18*a* and 18*b* (i.e., resistors 23) and to the loudspeaker array 14. The microprocessor 40 generally includes a voltage measurement circuit (not shown) to measure the voltage across the resistor(s) 23. Likewise, the voltage measurement circuit may also detect the open circuit condition in the event the loudspeaker array 14 is removed from the system 10.

The transceiver 44 enables the audio controller 12 to wirelessly receive the audio input signal from another audio source (not shown). In one example, the audio controller 12 may wirelessly communicate with the other audio source via Bluetooth, WiFi or other suitable wireless interface. It is recognized that the audio controller 12 may also wirelessly transmit the audio input signal to another playback device such as a mobile device, headphone, tablet, etc. The user interface 48 includes various switches (not shown) to enable the user to adjust volume, select various channels, bass control, reverb control, treble control, etc. While not shown, the audio controller 12 may also include a USB port for charging and/or receiving the audio input signal for playback. It is recognized that the audio controller 12 may include any number of channels for mixing different audio signals.

Figure 8:
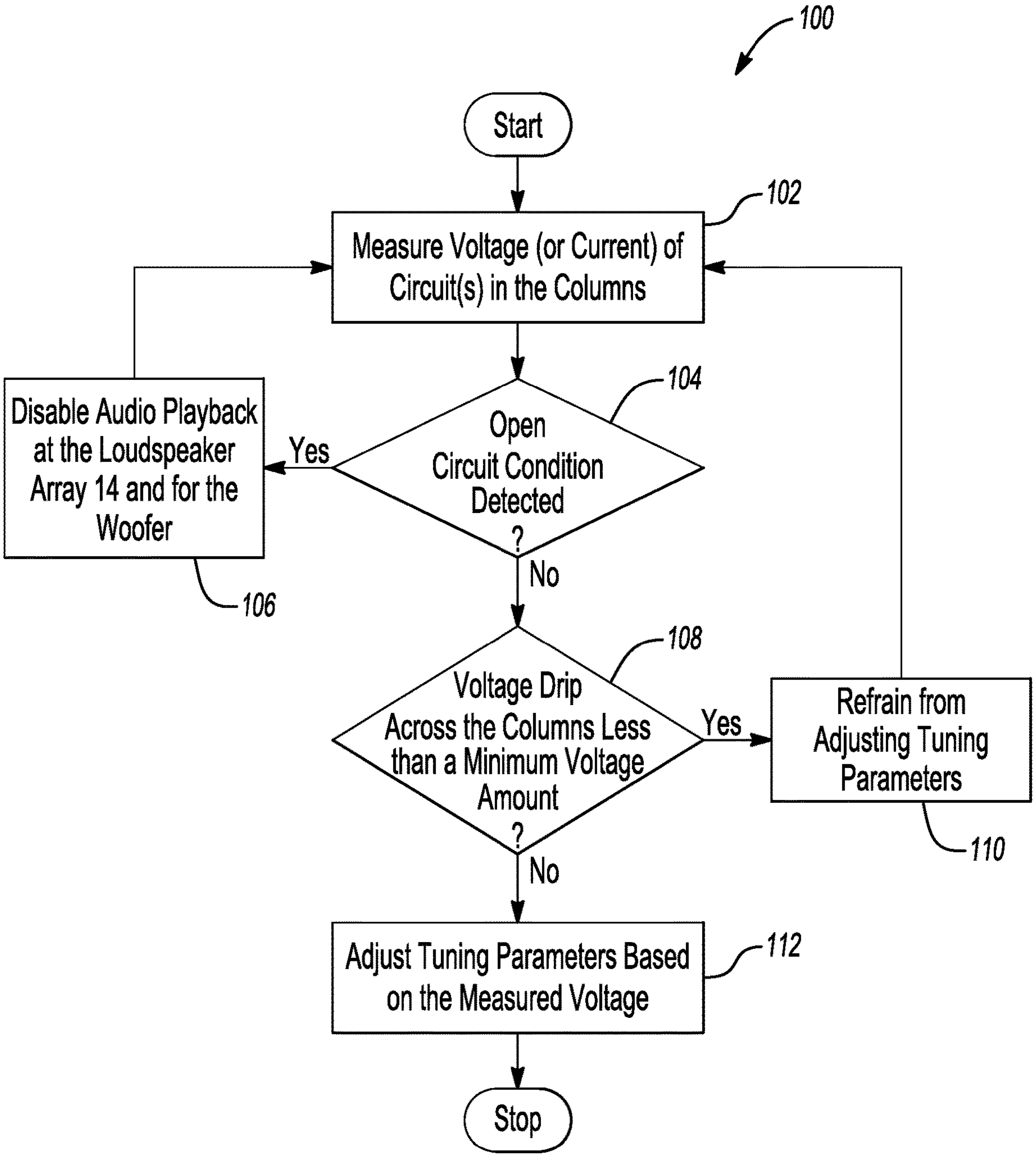
FIG. 8 generally depicts a method for automatic DSP adjustment in accordance to one embodiment.

FIG. 8 generally depicts a method 100 for automatic DSP adjustment in accordance to one embodiment. In operation 102, the audio controller 12 measures the voltage (or current) across the various pairs of wires 20*a*-20*b*, 22*a*-22*b*, 24*a*-24*b*, and/or 26*a*-26*b*. In the event the column(s) 18 are not attached to the loudspeaker array 14, the audio controller 12 may measure the voltage (or current) across wires 24*a*-24*b* and 26*a*-26*b*. In operation 104, the audio controller 12 determines whether an open circuit condition is present. If the audio controller 12 determines that an open circuit condition is present, then the method 100 moves to operation 106. If not, then the method 100 moves to operation 108.

In operation 106, the audio controller 12 disables the transmission of the audio input signal to the loudspeaker array 14 and to the loudspeaker 16 (e.g., mutes the audio playback). n operation 108, the audio controller 12 determines whether a voltage drop across the wires 20*a*-20*b* and 24*a*-24*b* is less than a predetermined minimum voltage amount. If the audio controller 12 determines that the voltage drop is less than the predetermined minimum voltage amount, then the method 100 moves to operation 110. In this case, the height of the loudspeaker array 14 has not moved and is in the default position (i.e., none of the columns are coupled to the audio controller 12). If not, then the method 100 moves to operation 112. In operation 110, the audio controller 12 refrains from adjusting any tuning parameters for the loudspeaker array 14 as there is no change in the height of the loudspeaker array 14. In operation 112, the audio controller 12 adjusts tuning parameters based on measured voltage which correspond to a height of the loudspeaker array 14.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A loudspeaker system comprising:

a loudspeaker array configured to playback an audio output in a listening environment;

an audio controller configured to provide the audio output to the loudspeaker array; and one or more insertable columns being positioned between the audio controller and the loudspeaker to adjust a height of the loudspeaker array relative to the audio controller, wherein the audio controller is further configured to adjust tuning parameters of the audio output based on the height.

2. The system of claim 1, wherein each insertable column includes at least one resistor.

3. The system of claim 2, wherein the audio controller is further configured to measure an electrical output across the at least one resistor for each insertable column.

4. The system of claim 3, wherein the audio controller is further configured to adjust the tuning parameters associated with the loudspeaker array based on the measured electrical output.

5. The system of claim 4, wherein the tuning parameters correspond to a delay, equalization, and parametric parameters.

6. The system of claim 1, further comprising at least one loudspeaker that is separated from the loudspeaker array by the one or more insertable columns.

7. The system of claim 6, wherein the at least one loudspeaker is a woofer and wherein the loudspeaker array includes at least one of any number of tweeters and any number of mid-range speakers.

8. The system of claim 6, wherein the audio controller is further configured to disable transmitting the audio output to the at least one loudspeaker in response to detecting that the loudspeaker array is electrically disconnected from the audio controller.

9. The system of claim 1, wherein the one or more insertable columns enable electrical communication between the audio controller and the loudspeaker array.

10. A loudspeaker system comprising:

a loudspeaker array configured to playback an audio output in a listening environment;

an audio controller configured to provide the audio output to the loudspeaker array; and one or more insertable columns being positioned between the audio controller and the loudspeaker array to adjust a height of the loudspeaker array relative to the audio controller based on a size of the listening environment, wherein the audio controller is further configured to adjust tuning parameters of the audio output based on the height.

11. The system of claim 10, wherein each insertable column includes at least one resistor.

12. The system of claim 11, wherein the audio controller is further configured to measure an electrical output across the at least one resistor for each insertable column.

13. The system of claim 12, wherein the audio controller is further configured to adjust the tuning parameters associated with the loudspeaker array based on the measured electrical output.

14. The system of claim 13, wherein the tuning parameters correspond to a delay, equalization, and parametric parameters.

15. A loudspeaker system comprising:

a loudspeaker array configured to playback an audio output in a listening environment;

one or more insertable columns being electrically connected to the loudspeaker array; and an audio controller configured to provide the audio output to the loudspeaker array via the one or more insertable columns, wherein the one or more insertable columns adjust a height of the loudspeaker system; and wherein the audio controller is further configured to adjust tuning parameters of the audio output based on the height.

16. The system of claim 15, wherein the one or more insertable columns increases an overall height of the loudspeaker array relative to a loudspeaker enclosure including at least one loudspeaker.

17. The system of claim 15, wherein each insertable column includes at least one resistor.

18. The system of claim 17, wherein the audio controller is further configured to measure an electrical output across the at least one resistor for each insertable column.

19. The system of claim 18, wherein the audio controller is further configured to adjust the tuning parameters associated with the loudspeaker array based on the measured electrical output.

20. The system of claim 19, wherein the tuning parameters correspond to a delay, equalization, and parametric parameters.

* * * * *